United States Patent
Yang

(10) Patent No.: US 9,392,682 B2
(45) Date of Patent: Jul. 12, 2016

(54) LED LAMP WITH TAPERED PCB

(71) Applicant: Kevin Yang, Lomita, CA (US)

(72) Inventor: Kevin Yang, Lomita, CA (US)

(*) Notice: Subject to any disclaimer, the term of this patent is extended or adjusted under 35 U.S.C. 154(b) by 131 days.

(21) Appl. No.: 14/517,598

(22) Filed: Oct. 17, 2014

(65) Prior Publication Data

US 2016/0109103 A1 Apr. 21, 2016

(51) Int. Cl.
| | | |
|---|---|---|
| F21V 19/00 | (2006.01) | |
| H05K 1/00 | (2006.01) | |
| F21Y 103/00 | (2016.01) | |
| F21K 99/00 | (2016.01) | |
| F21Y 101/02 | (2006.01) | |

(52) U.S. Cl.
CPC .............. *H05K 1/00* (2013.01); *F21V 19/004* (2013.01); *F21V 19/005* (2013.01); *F21V 19/0045* (2013.01); *F21K 9/90* (2013.01); *F21Y 2101/02* (2013.01); *F21Y 2103/003* (2013.01)

(58) Field of Classification Search
CPC ............ F21V 19/003–19/0055; F21V 19/045; F21Y 2103/003; H01L 2023/405; H01L 33/642; H01L 33/644; H05K 2201/09154–2201/09181; H05K 7/2049; F21S 4/20; F21S 4/28
See application file for complete search history.

(56) References Cited

U.S. PATENT DOCUMENTS

| | | | | |
|---|---|---|---|---|
| 2009/0097249 | A1* | 4/2009 | Lee | ............................ F21K 9/00 362/249.02 |
| 2012/0314431 | A1* | 12/2012 | Lin | ...................... F21V 19/0045 362/382 |

FOREIGN PATENT DOCUMENTS

| | | | | | |
|---|---|---|---|---|---|
| CN | WO 2013007450 | A1 * | 1/2013 | ............ | F21V 3/0436 |

* cited by examiner

*Primary Examiner* — Anh Mai
*Assistant Examiner* — Steven Horikoshi
(74) *Attorney, Agent, or Firm* — CLement Cheng

(57) ABSTRACT

An LED lamp has a PCB at least partially made of metal and a base configured to receive the PCB in a slot formed on the base. The base has a base top surface and the slot has a tapered cross-section. A first sidewall is formed in the slot. The first sidewall is formed at a first sidewall angle that is less than 90°. A second sidewall is formed in the slot. The second sidewall is formed at a second sidewall angle. A top protrusion is formed on a base top surface. The top protrusion has a top protrusion first position and a top protrusion second position. A pair of edges are formed on the PCB, namely a first edge formed on the PCB and a second edge formed on the PCB. The first edge is tapered to engage the first sidewall.

11 Claims, 3 Drawing Sheets

LED LAMP WITH TAPERED PCB

FIELD OF THE INVENTION

The present invention is in the field of LED lighting, specifically tapered printed circuit board light-emitting diode technology.

DISCUSSION OF RELATED ART

Traditionally, LED strips have substrates of printed circuit boards (PCB) that have been installed in extrusion channels. The extrusion channels are then mounted to light fixtures where the extrusion channels can form the frames of the light fixtures. The extrusion channels are typically made of aluminum, and are connected to the LED strip substrates by a thermal tape or thermal paste or other coating that improves thermal conductivity between the substrate and the extrusion channel. The traditional LED strip has a rectangular substrate which is not tapered.

SUMMARY OF THE INVENTION

An LED lamp has a PCB at least partially made of metal and a base configured to receive the PCB in a slot formed on the base. The base has a base top surface and the slot has a tapered cross-section. A first sidewall is formed in the slot. The first sidewall is formed at a first sidewall angle that is less than 90°. A second sidewall is formed in the slot. The second sidewall is formed at a second sidewall angle. A top protrusion is formed on a base top surface. The top protrusion has a top protrusion first position and a top protrusion second position. A pair of edges are formed on the PCB, namely a first edge formed on the PCB and a second edge formed on the PCB. The first edge is tapered to engage the first sidewall.

The LED lamp also optionally features the PCB with a tapered cross-section. The LED lamp can have an initial second sidewall angle, with the first sidewall angle fixed. The second sidewall angle starts at the initial second sidewall angle and after crimping moves to the second sidewall angle. The first edge includes a first edge upper face and a first edge lower face. The first edge upper face meets the first edge lower face at a first edge ridge, and the first edge upper face is angled relative to the first edge lower face. The second edge includes a second edge upper face and a second edge lower face. The second edge upper face meets the second edge lower face at a second edge ridge, and the second edge upper face is angled relative to the second edge lower face. The top protrusion second position forms the second sidewall angle to be less than 90°.

GLOSSARY

LED: light emitting diode, a type of lamp commonly formed on a chip.

PCB: printed circuit board, a circuit printed on a board.

Tapered PCB: the PCB cross-sectional width is not constant along the vertical direction.

Orthogonal: (adjective) of or involving right angles; at right angles.

Figure 1:
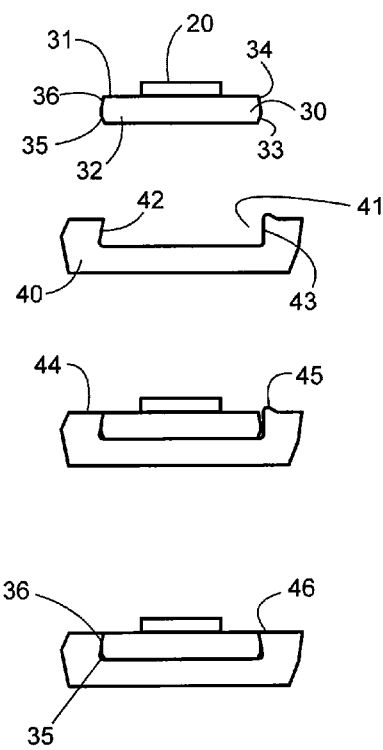
FIG. 1 is a cross-sectional view of the installation steps of the present invention in three steps: an orienting step; an insertion step before crimping, and after crimping.
Figure 2:
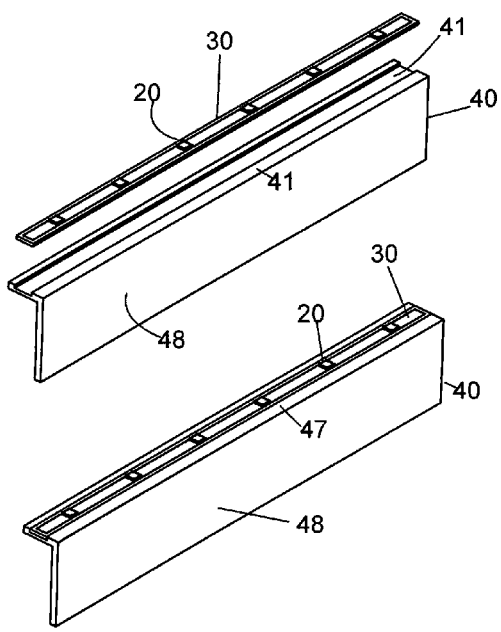
FIG. 2 is a perspective view of the installation step of the present invention.
Figure 3:
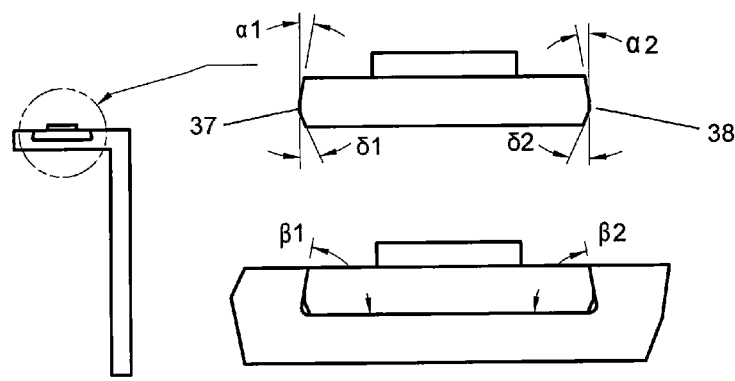
FIG. 3 is a diagram showing the relative angles during installation.
Figure 4:
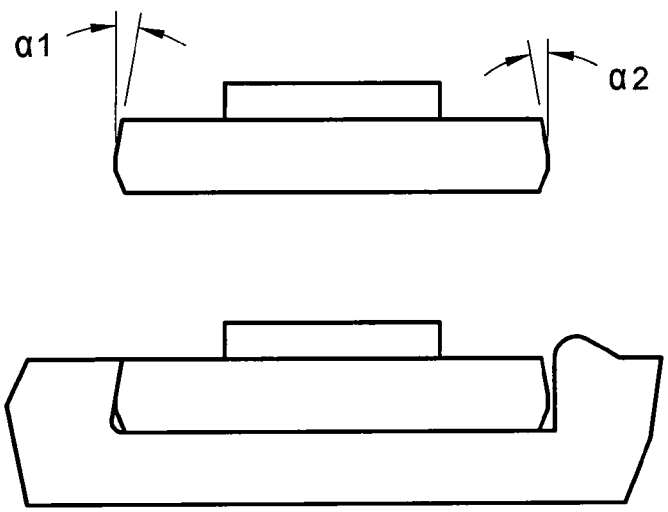
FIG. 4 is a close-up view of the installation before crimping.
Figure 5:
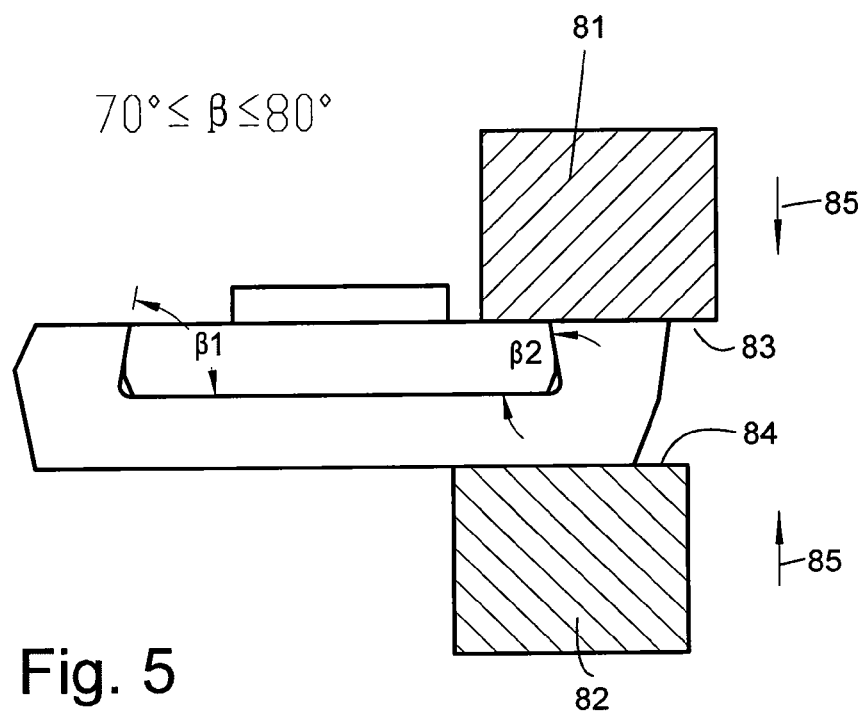
FIG. 5 is a close-up view of the crimping step.

The following call out list of elements can be a useful guide in referencing the elements of the drawings.
20 LED Chip
30 PCB Substrate
31 Conductive Layer
32 Lower Substrate Layer
33 PCB Second Edge Lower Face
34 PCB Second Edge Upper Face
35 PCB First Edge Lower Face
36 PCB First Edge Upper Face
37 PCB First Edge Ridge
38 PCB Second Edge Ridge
40 Base
41 Slot
43 Second Wall
44 Base Top Surface
45 Top Protrusion In First Position
46 Top Protrusion In Second Position
47 Horizontal Base Portion
48 Vertical Base Portion
81 First Die
82 Second Die
83 First Die Face
84 Second Die Face
85 Crimping Force
α1 PCB First Edge Upper Face Angle
α2 PCB Second Edge Upper Face Angle
β1 First Sidewall Angle
β2 Second Sidewall Angle
δ1 PCB First Edge Lower Face Angle
δ2 PCB Second Edge Lower Face Angle

DETAILED DESCRIPTION OF THE PREFERRED EMBODIMENT

The present invention is an LED lamp with a tapered substrate for a light-emitting diode. The substrate is tapered along its length such that it has a generally trapezoidal cross-section. The substrate is generally rectangular from a top view and has an aluminum main portion with a conductive top surface. An insulating layer can be disposed between the conductive top surface and the aluminum main portion. The substrate has a flat bottom and a flat top. LED lights are mounted to the top surface of the substrate.

An LED chip 20 is typically mounted to a PCB substrate 30. The PCB substrate 30 can have a conductive layer 31 laminated or bonded over a lower substrate layer 32. The lower substrate layer 32 can be made of aluminum in an aluminum extrusion. The lower substrate layer 32 preferably includes a pair of edges such as a left and right edge or a first edge and a second edge. The first edge can have a PCB first edge upper face 36 that is angled to and above a PCB first edge lower face 35. The PCB first edge upper face 36 meets with and is angled to the PCB first edge lower face 35 at a PCB first edge ridge 37 which protrudes from the first edge of the lower substrate layer 32. Similarly, the second edge can have a PCB second edge lower face 33 that is angled to and below a PCB second edge upper face 34. The PCB second edge upper face 34 is preferably angled to and meets with the PCP second edge lower face 35 at a PCB second edge ridge 38 which protrudes from the second edge of the lower substrate layer 32.

Consequently, the PCB substrate 30 has a tapered profile with a first edge and a second edge formed at non-orthogonal angles to the conductive layer 31 of the PCB substrate.

The PCB substrate 30 has a PCB first edge upper face angle $\alpha 1$ which is the angle between the PCB first edge upper face and an orthogonal line relative to the conductive layer 31. The PCB substrate has a PCB second edge upper face angle $\alpha 2$ which is the angle between the PCB second edge upper face and an orthogonal line relative to the conductive layer 31. The orthogonal line relative to the conductive layer 31 is shown as a vertical line and is the side edge of the PCB substrate 30 if the PCB substrate 30 had been a traditional rectangular cross-section PCB substrate.

The PCB substrate 30 additionally includes a PCB first edge lower face angle $\delta 1$ and a PCB second edge lower face angle $\delta 2$. The PCB first edge lower face angle is the angle between the orthogonal line relative to the conductive layer 31 and the PCB first edge lower face 35. The PCB second edge lower face angle is the angle between the orthogonal line relative to the conductive layer 31 and the PCB second edge lower face 33.

A base member 40 has a slot 41 that is configured to receive the PCB 30. The base member 40 of the PCB 30 can both be made of parts having extruded aluminum. The slot 40 generally includes a first sidewall 42 and a second sidewall 43. The first sidewall 42 is tapered inward and the second sidewall 43 is also tapered inward. The base member 40 has a base top surface 44 that can be flat on a first side. The base member 40 can have a top protrusion in a first position 45 extending from a base top surface 44. The top protrusion can be crimped to a second position at a top protrusion second position 46. The tapered profile of the PCB first edge upper face 36 engages with the tapered profile of the first sidewall 42. The tapered profile of the PCB second edge upper face 34 engages with the tapered profile of the second sidewall 43. The first sidewall is tapered at a first sidewall angle $\beta 1$ and the second sidewall is tapered at a second sidewall angle $\beta 2$. The first sidewall angle and second sidewall angle are measured as the angular differential from an orthogonal position of the top surface of the slot 41, which would be a vertical line as shown in the drawings.

Figure 6:
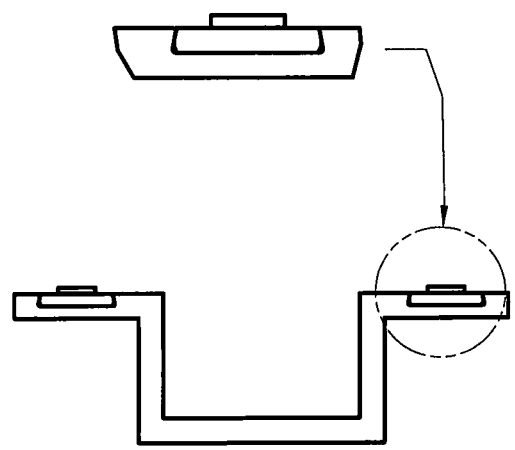
FIG. 6 is a cross-section of a channel configuration.
Figure 7:
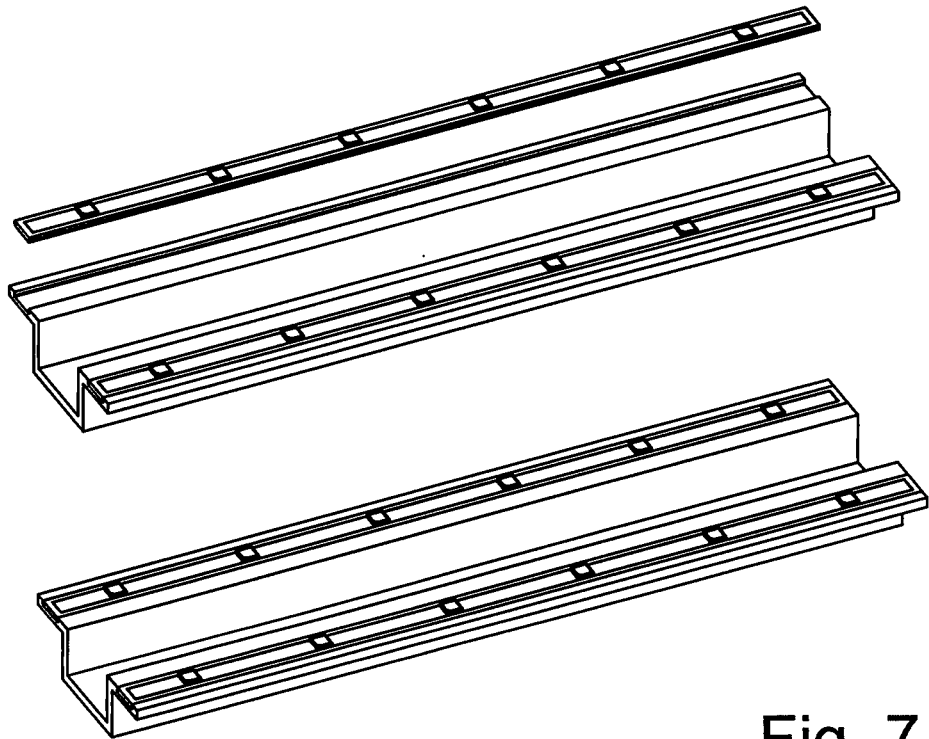
FIG. 7 is a perspective view of the installation on a channel configuration.

The base member 40 can have a horizontal base portion 47 that meets with a vertical base portion 48. The base member 40 can also have a pair of horizontal base portions 47 that are connected to a pair of vertical base portions 48 with a lower horizontal base portion connecting the vertical base portions 48 to provide a U-shaped channel as seen in FIG. 6, 7.

The PCB substrate 30 has sufficient clearance to drop into the slot 41 without interference. The slot 41 has a second sidewall 43 that is initially generally orthogonal, but then is crimped to a second sidewall angle for a tapered profile. A first die 81 and a second die 82 can deform the top protrusion in first position 45 to a top protrusion in second position 46. The material of the top protrusion is flattened between the first die 81 and the second die 82 because of the malleability of aluminum or other heat transfer friendly metal. The second sidewall angle changes from the initial angle to the installed angle. The second sidewall angle has an initial angle that is less than an installed angle. The first die 81 and the second die 82 can be formed as a press, or can be formed as rollers. The rollers or press mechanism can have an elastomeric main body with a metal, preferably steel, first die 81 and second die 82 mounted to the elastomeric main body.

The preferred installation steps include first extruding an aluminum PCB substrate having the tapered profile and also extrude a matching base 40 having a matching tapered profile slot 41. The second step is to install a conductive layer on the PCB substrate which may also include an electrically insulative layer as part of the conductive layer. The third step is to mount the LED chips 20 to the PCB substrate 30. The fourth step is to place the PCB substrate 30 into the slot 41. The fifth step is to press the first die 81 and second die 82 over the top protrusion using a crimping force 85 that is adjusted to seat or fuse the PCB substrate 30 to the base 40. In the fifth step, the first die face 83 and the second die face 84 are positioned over the top protrusion so as to completely cover it during material deformation.

Preferably, the PCB first edge upper face angle $\alpha 1$ and the PCB second edge upper face angle $\alpha 2$ are between 10° and 15°. Also, preferably the first sidewall angle $\beta 1$ and the second sidewall angle $\beta 2$ are between 70° and 80°. The first sidewall angle can be up to slightly less than 90° such as 88°. Also, the PCB first edge upper face and the PCB second edge upper face can be up to slightly less than 0° such as 2°. Although the sum of the sidewall angle and the PCB upper face angle should be 90° after crimping, the sum does not necessarily have to be 90° before crimping as deformation may be preferred for heat transfer efficiency.

Although the invention has been disclosed in detail with reference only to the preferred embodiments, those skilled in the art will appreciate that various other embodiments can be provided without departing from the scope of the invention. For example, although not preferred, the customary thermal tape or thermal paste can be added between the PCB substrate and the slot of the base. Also, only one side of the PCB needs to be tapered. Accordingly, the invention is defined only by the claims set forth below.

The invention claimed is:

1. An LED lamp comprising:
   a. a PCB at least partially made of metal;
   b. a base configured to receive the PCB in a slot formed on the base, wherein the base has a base top surface, wherein the slot has a tapered cross-section;
   c. a first sidewall formed in the slot, wherein the first sidewall is formed at a first sidewall angle that is less than 90°;
   d. a second sidewall formed in the slot, wherein the second sidewall is formed at a second sidewall angle;
   e. a top protrusion formed on a base top surface, wherein the top protrusion has a top protrusion first position and a top protrusion second position; and
   f. a pair of edges formed on the PCB, namely a first edge formed on the PCB and a second edge formed on the PCB, wherein the first edge is tapered to engage the first sidewall wherein the first edge includes a first edge upper face and a first edge lower face.

2. The LED lamp of claim 1, wherein the first edge upper face meets the first edge lower face at a first edge ridge, wherein the first edge upper face is angled relative to the first edge lower face.

3. An LED lamp comprising:
   a. a PCB at least partially made of metal;
   b. a base configured to receive the PCB in a slot formed on the base, wherein the base has a base top surface, wherein the slot has a tapered cross-section;
   c. a first sidewall formed in the slot, wherein the first sidewall is formed at a first sidewall angle that is less than 90°;

d. a second sidewall formed in the slot, wherein the second sidewall is formed at a second sidewall angle;
e. a top protrusion formed on a base top surface, wherein the top protrusion has a top protrusion first position and a top protrusion second position; and
f. a pair of edges formed on the PCB, namely a first edge formed on the PCB and a second edge formed on the PCB, wherein the first edge is tapered to engage the first sidewall, wherein the second edge includes a second edge upper face and a second edge lower face.

4. The LED lamp of claim 3, wherein the second edge upper face meets the second edge lower face at a second edge ridge, wherein the second edge upper face is angled relative to the second edge lower face.

5. The LED lamp of claim 3, wherein the top protrusion second position forms the second sidewall angle to be less than 90°.

6. The LED lamp of claim 5, wherein the PCB has a tapered cross-section.

7. The LED lamp of claim 5, further comprising an initial second sidewall angle, wherein the first sidewall angle is fixed, but the second sidewall angle starts at the initial second sidewall angle and after crimping moves to the second sidewall angle.

8. An LED lamp comprising:
a. a PCB at least partially made of metal;
b. a base configured to receive the PCB in a slot formed on the base, wherein the base has a base top surface, wherein the slot has a tapered cross-section;
c. a first sidewall formed in the slot, wherein the first sidewall is formed at a first sidewall angle that is less than 90°;
d. a second sidewall formed in the slot, wherein the second sidewall is formed at a second sidewall angle;
e. a top protrusion formed on a base top surface, wherein the top protrusion has a top protrusion first position and a top protrusion second position; and
f. a pair of edges formed on the PCB, namely a first edge formed on the PCB and a second edge formed on the PCB, wherein the first edge is tapered to engage the first sidewall wherein the top protrusion second position forms the second sidewall angle to be less than 90°, wherein the first edge includes a first edge upper face and a first edge lower face.

9. The LED lamp of claim 8, wherein the first edge upper face meets the first edge lower face at a first edge ridge, wherein the first edge upper face is angled relative to the first edge lower face.

10. The LED lamp of claim 9, wherein the second edge includes a second edge upper face and a second edge lower face.

11. The LED lamp of claim 10, wherein the second edge upper face meets the second edge lower face at a second edge ridge, wherein the second edge upper face is angled relative to the second edge lower face.

\* \* \* \* \*